United States Patent [19]

Barwig et al.

[11] Patent Number: 5,001,762

[45] Date of Patent: Mar. 19, 1991

[54] MINIATURE MODULAR VOLUME CONTROL AND INTEGRATED CIRCUIT ASSEMBLY FOR USE WITH A HEARING AIR

[75] Inventors: David R. Barwig, Plymouth; Michael P. Geraci, Bloomington, both of Minn.

[73] Assignee: Resistance Technology, Inc., Arden Hills, Minn.

[21] Appl. No.: 332,514

[22] Filed: Mar. 31, 1989

[51] Int. Cl.[5] ........................ H03G 3/00; H01C 10/50

[52] U.S. Cl. .................................................. 381/68.4

[58] Field of Search ........................ 381/68, 68.4, 68.6, 381/69, 69.2; 361/400, 401, 397, 392, 393, 394, 395, 399, 405, 406

[56] References Cited

U.S. PATENT DOCUMENTS

| | | | |
|---|---|---|---|
| 3,492,536 | 1/1970 | Girolamo et al. | 361/400 |
| 3,496,306 | 2/1970 | Pollak | 381/68.6 |
| 3,684,830 | 8/1972 | MacLagan et al. | 381/68 |
| 4,329,676 | 5/1982 | McDonald et al. | 381/69 |

FOREIGN PATENT DOCUMENTS

| | | | |
|---|---|---|---|
| 0263667 | 4/1988 | European Pat. Off. | 381/68 |

*Primary Examiner*—Jin F. Ng
*Assistant Examiner*—M. Nelson McGeary, III
*Attorney, Agent, or Firm*—Kinney & Lange

[57] ABSTRACT

A hearing aid faceplate assembly includes a faceplate having a volume control/switch receiving aperture. A volume control/switch integrated circuit assembly is mounted within the aperture. The volume control/switch integrated circuit assembly includes a module substrate, an amplifier mounted to the substrate and a volume control mounted to the substrate and electrically coupled to the amplifier.

27 Claims, 2 Drawing Sheets

Fig. 1
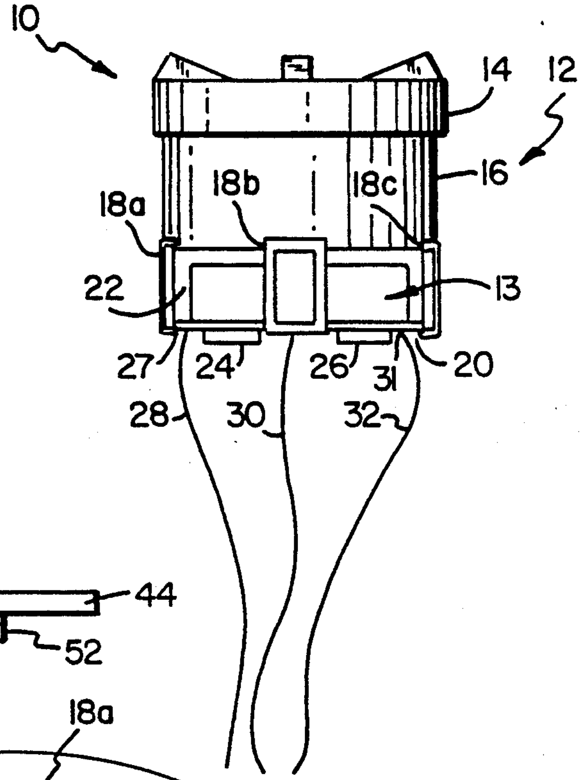
Fig. 4
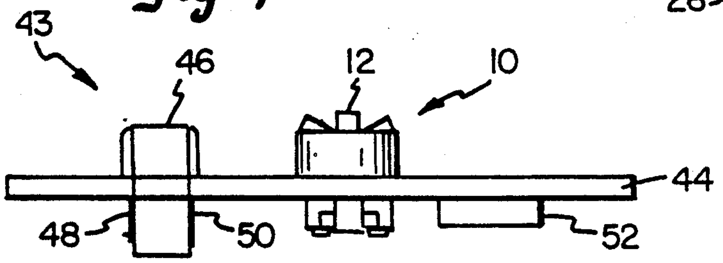
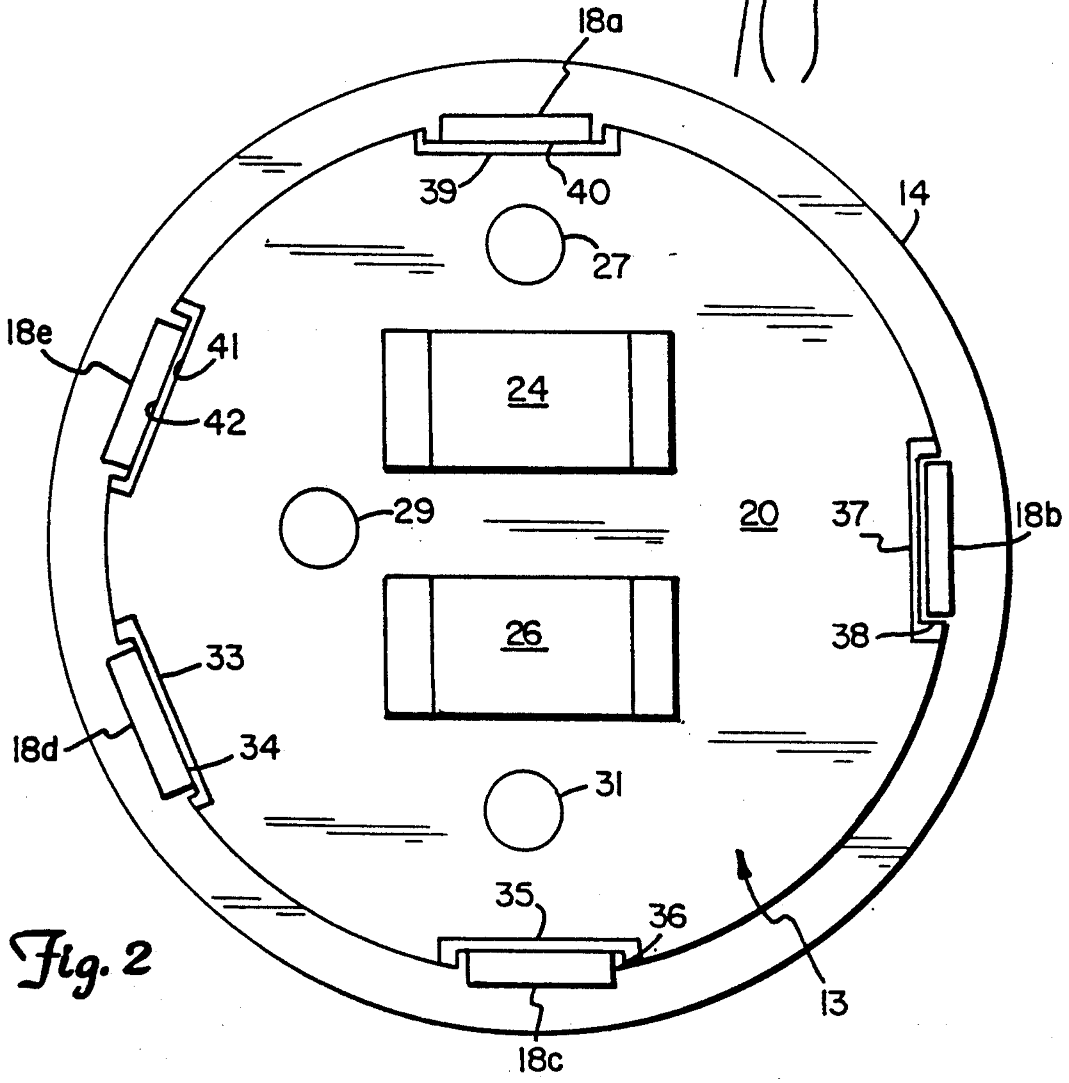
Fig. 2

MINIATURE MODULAR VOLUME CONTROL AND INTEGRATED CIRCUIT ASSEMBLY FOR USE WITH A HEARING AIR

BACKGROUND OF THE INVENTION

1. Field of the Invention

The present invention relates to a volume control. More particularly, the present invention relates to a modular volume control and integrated circuit assembly for use in a hearing aid.

2. Description of the Prior Art

One of the largest costs of doing business encountered by hearing aid manufacturers is the cost associated with hearing aids which are returned. In fact, it is not uncommon for 20% of all hearing aids manufactured by any particular manufacturer to be returned. This is caused by several factors.

First, different users of hearing aids prefer different frequencies of sound to be amplified by the hearing aid. Since all hearing aids do not pass and amplify the exact same frequencies in the exact same manner, people who use hearing aids may prefer one hearing aid over another merely because the users prefer the way it sounds. Before actually using a hearing aid, there is no sure way that a user can tell if the sound of the hearing aid will be satisfactory.

A second factor which is responsible for a high number of hearing aids being returned is the fact that physically fitting a hearing aid to a particular user is not an exact science. Typically, the user of a hearing aid has a mold of their ear taken. In manufacturing a hearing aid, the manufacturer may or may not exactly duplicate the mold. Therefore, different hearing aids from different manufacturers may be more or less comfortable for the user even though the manufacturers all used the same mold.

For these reasons, before a user purchases a hearing aid, they typically order several different hearing aids from several different manufacturers. The user tries each of these hearing aids and keeps only the hearing aid which the user prefers based on sound, comfort and performance. The remaining hearing aids are returned to their respective manufacturers. This is a common and widely accepted practice in the hearing aid industry.

Hearing aids generally comprise a mold portion which contacts the users ear, a hearing aid faceplate and electronic components. The electronic components include a microphone for picking up sound, an amplifier for amplifying the sound, an on-off switch, a volume control which the user operates to control the volume of the sound, a speaker for providing the amplified sound to the user and a power source, such as a battery, for powering the hearing aid. The electronic components are typically assembled on the hearing aid faceplate using known assembly techniques such as soldering, glueing and heat staking. Once the electronic components are assembled on the hearing aid faceplate, the assembled faceplate is mounted in the mold portion to form a completed hearing aid.

In past hearing aids, each of the electronic components was a separate component which was separately assembled on the hearing aid faceplate. This made assembly very labor intensive and costly. Also, this made the cost of doing business due to returned hearing aids very high. Since each of these components were separate, salvaging them and reworking them into new hearing aid faceplates required a labor intensive process which was very costly.

In addition, the volume control component in past hearing aids was generally heat staked or glued into the hearing aid faceplate. This process required the use of solvents or glues which were potentially damaging to the volume control and other electronic components of the hearing aid.

SUMMARY OF THE INVENTION

The present invention is responsive to a need to reduce the cost of doing business in the hearing aid industry. Particularly, this invention is responsive to the need to reduce costs associated with assembling hearing aids and with salvaging returned hearing aids. The present invention achieves greater modularity in hearing aid components than prior hearing aid assemblies. Therefore, greater salvageability and ease of assembly are achieved.

A miniature volume control and integrated circuit module controls volume of sound. Amplifier means for amplifying sound signals is mounted on a substrate having a substrate perimeter. A volume control, having a volume control perimeter, is mounted to the substrate and is electrically coupled to the amplifier means.

Tab receiving notches are provided in the substrate perimeter and have electrical contacts coupled to the amplifier means. Coupling tabs, which extend from the volume control, are inserted into, and electrically coupled to the tab receiving notches. Therefore, the amplifier means is electrically coupled to the volume control.

BRIEF DESCRIPTION OF THE DRAWINGS

FIG. 1 is a diagram of the volume control module of the present invention.

FIG. 2 is an end view of the volume control module.

FIG. 4 is a side view of hearing aid components mounted in a faceplate.

DETAILED DESCRIPTION OF THE PREFERRED EMBODIMENTS

Figure 3:
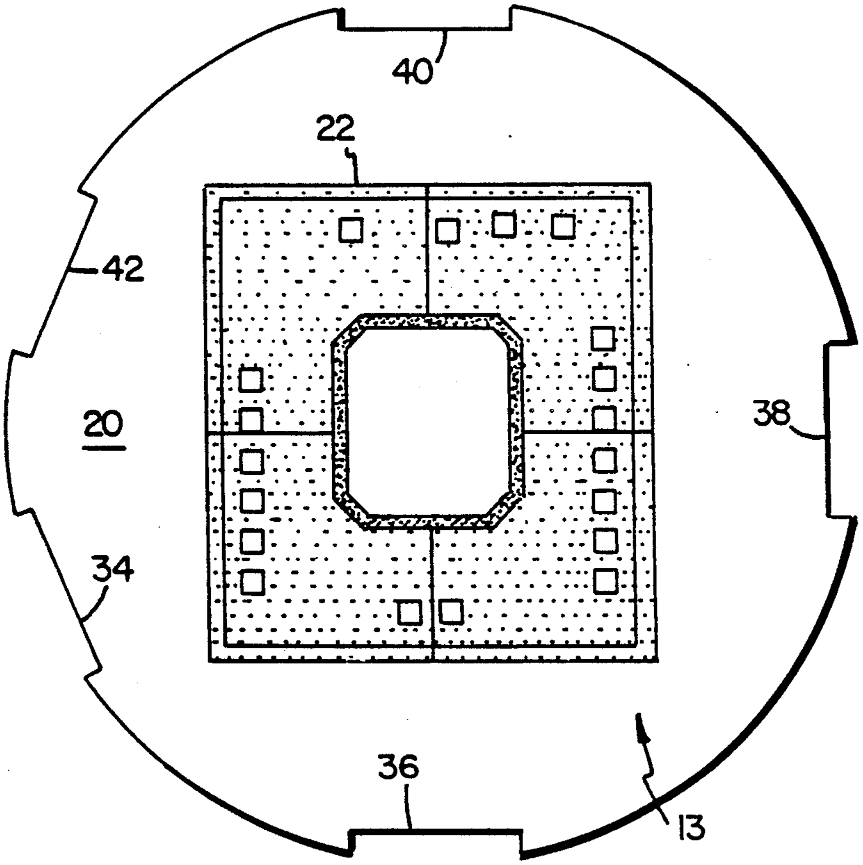
FIG. 3 is a top view of an amplifier circuit mounted on a substrate.

FIG. 1 is a diagram of miniaturized volume control module 10 in accordance with the present invention. Volume control module 10 includes volume control potentiometer and on/off switch 12 (hereinafter referred to as potentiometer 12) mounted to hybrid integrated circuit amplifier 13.

Potentiometer 12 includes a potentiometer mechanism and an on/off switch (neither of which are separately shown) mounted within a cylindrical body 16 and mechanically linked to rotatable cap 14 on one end of cylindrical body 16. Contact tabs **18*a*–18*e* (seen in FIG. 2) are metalized, conductive strips which are circumferentially arranged about the perimeter of cylindrical body 16. Contact tabs 18*a*–18*e* (only three of which, 18*a*, 18*b* and 18*c*, are shown in FIG. 1) extend from the end of cylindrical body 16 opposite cap 14**. Two of the contact tabs are coupled to the on/off switch while the other three are coupled to the potentiometer mechanism.

Hybrid integrated circuit amplifier 13 (best shown in FIGS. 1, 2 and 3) includes substrate 20 (which is typically about 0.16 inches in diameter), integrated circuit (IC) 22, conductor pads 27, 29 and 31, and capacitors 24 and 26. Substrate 20 has a plurality of tab receiving notches 34, 36, 38, 40 and 42 circumferentially arranged about its perimeter. The tab receiving notches have plated edges which form associated tab contact terminals 33, 35, 37, 39 and 41 Tab receiving notches 34, 36, 38, 40 and 42 are slightly larger than contact tabs **18*a*–18*e* and receive contact tabs 18*a*–18*e*. Contact tabs 18*a*–18*e* are soldered to contact terminals 33, 35, 37, 39 and 41 thereby making electrical connection with the contact terminals and securing integrated circuit amplifier 13 to potentiometer 12**.

In this preferred embodiment, the perimeter of substrate 20 is substantially circular. Also, the diameter of substrate 20 is the same as, or slightly smaller than the perimeter of cylindrical body 16 of potentiometer 12. The circumferential arrangement of contact tabs **18*a*–18*e* about the perimeter of cylindrical body 16 corresponds to the circumferential arrangement of tab receiving notches 34, 36, 38, 40 and 42 about the perimeter of substrate 20. This allows contact tabs 18*a*–18*e* to mate with tab receiving notches 34, 36, 38, 40 and 42 to form a modular connection between potentiometer 12 and substrate 20. In other embodiments, other shapes can be used for substrate 20 and cylindrical body 16 as long as potentiometer 12 is capable of being mounted on substrate 20**.

Integrated circuit 22, capacitors 24 and 26 and conductors 28, 30 and 32 are coupled to substrate 20 using known hybrid circuit techniques. IC 22 has amplifier terminals which are electrically coupled to contact terminals 33, 35, 37, 39 and 41 in tab receiving notches 34, 36, 38, 40 and 42 on substrate 20. Therefore, an electrical connection between potentiometer 12 and IC 22 is accomplished through the electrical connection between the amplifier terminals and the contact terminals 33, 35, 37, 39 and 41 on substrate 20, and the electrical connection between contact terminals 33, 35, 37, 39 and 41 and potentiometer 12 through coupling tabs **18*a*–18*e***.

Conductors 28, 30 and 32 typically comprise a plurality of wires which are used to connect volume control module 10 to other hearing aid circuitry. These wires are connected to substrate 20 at a plurality of conductor pads (in this embodiment, conductor pads 27, 29 and 31) which are electrically coupled to the amplifier terminals on substrate 20. Also, RTV or some other type of elastomer is typically used as a strain relief to prevent the connections at conductor pads 27, 29 and 31 from breaking.

Figure 5:
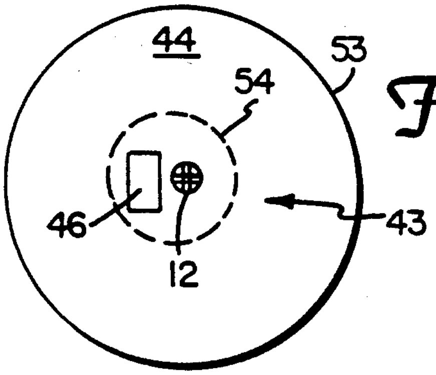
FIG. 5 is a top view of the hearing aid components mounted in the faceplate.

Volume control module 10 is used in conjunction with faceplate assembly 43 shown in FIGS. 4 and 5. Faceplate 44 includes a first aperture with battery connection terminals 48 and 50, for receiving battery 46, and a second aperture for receiving volume control module 10. Volume control module 10 is detachably connected to faceplate 44 and extends through the second aperture. In one embodiment, volume control module 10 is detachably connected to faceplate 44 with a snap ring assembly (not shown).

Other hearing aid components which are assembled in faceplate assembly 43 comprise audio circuitry 52. Audio circuitry 52 includes a microphone for receiving sound and a speaker for providing amplified sound to a hearing aid user. The speaker and microphone in audio circuitry 52, as well as battery connection terminals 48 and 50 are electrically coupled to volume control module 10 in a known manner by conductors (not shown). The microphone in audio circuitry 52 picks up external sound. The sound is variably amplified by integrated circuit 22 based on the position of rotatable cap 14 with respect to cylindrical body 16 of potentiometer 12. The amplified sound is provided to the speaker in audio circuitry 52 which, in turn, provides the amplified sound to the hearing aid user. Battery 46 powers the components of faceplate assembly 43.

FIG. 5 shows a top view of faceplate assembly 43. For ease of assembly, faceplate 44 has a perimeter 53 which is much larger than the perimeter required for use in a completed hearing aid. Therefore, once the components in faceplate assembly 43 have been assembled, the perimeter of faceplate 44 is reduced to perimeter 54 which is the proper size for use in a hearing aid.

Figure 6:
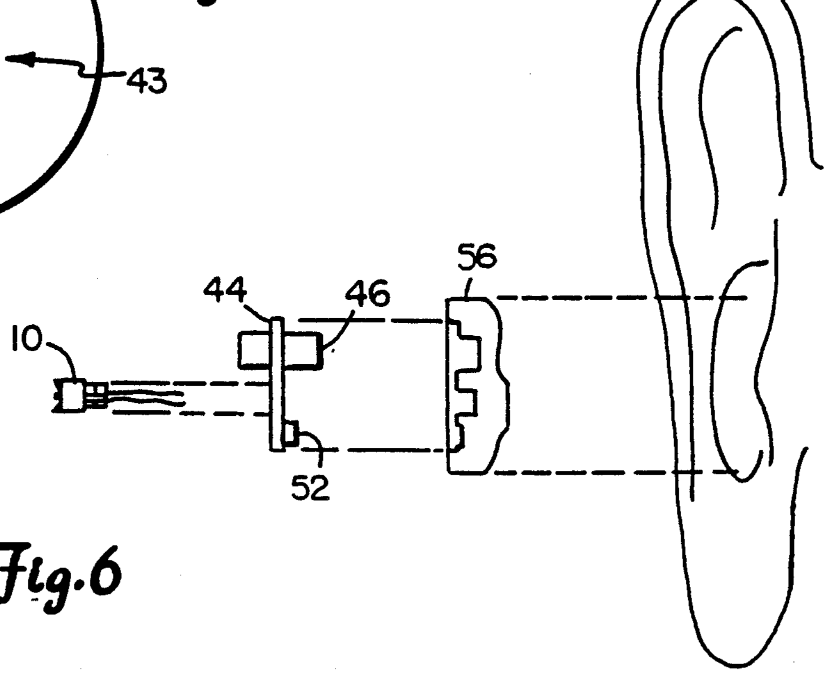
FIG. 6 is an exploded view of a hearing aid.

FIG. 6 is an exploded view of a hearing aid. Volume control module 10 is detachably inserted into faceplate 44. With volume control module 10 inserted in faceplate 44, the entire faceplate assembly 43 is inserted into ear mold 56. Ear mold 56 is manufactured to conform to a particular users ear and is also shaped to accommodate the insertion of faceplate assembly 43. With faceplate assembly 43 inserted into ear mold 56, the hearing aid is entirely assembled and is ready for insertion into an ear of a hearing aid user.

The modularity of volume control module 10 greatly reduces the amount of time required for electrical and mechanical assembly of the hearing aid. Once volume control module 10 is assembled by soldering contact tabs **18*a*–18*e* to contact terminals 33, 35, 37, 39 and 41 in tab receiving notches 34, 36, 38, 40 and 42, volume control module 10 is detachably inserted into faceplate 44. Then, conductors (not shown) are cut to the proper size and soldered to the designated components in faceplate assembly 43. This decreases the cost of labor intensive assembly associated with previous hearing aids where potentiometer 12 and the amplifier circuitry were separate components which each had to be separately soldered into faceplate assembly 43**.

Also, due to the modularity of potentiometer 12 and hybrid integrated circuit amplifier 13 of volume control module 10, if the hearing aid is returned, salvageability is greatly increased. Very little rework is required to salvage substantially the entire reusable portion of the hearing aid. Faceplate assembly 43 is removed from mold 56. Then, battery 46 is removed from faceplate assembly 43 and the conductors are unsoldered or cut. Finally, volume control module 10 is simply detached from faceplate 44 for insertion into another faceplate in another faceplate assembly.

This reduces the labor costs which were previously associated with soldering and unsoldering each individual component in a hearing aid when the hearing aid was returned. Also, this greatly increases the number of parts which are salvageable from a hearing aid assembly. Therefore, the costs of doing business in the hearing aid industry associated with assembling, salvaging and reworking hearing aids are reduced.

In addition, it should be noted that volume control module 10 is neither glued nor heat staked into faceplate 44 as was typically done in the past. Rather, a detachable connection is used. This reduces both cost and time associated with assembly and disassembly of faceplate assembly 43 and eliminates the use of potentially damaging solvents and glues in assembling volume control module 10.

Although the present invention has been described with reference to preferred embodiments, workers skilled in the art will recognize that changes may be made in form and detail without departing from the spirit and scope of the invention.

What is claimed is:

1. A miniature volume control and integrated circuit module, comprising:

a substrate having a substrate perimeter and a first surface;

amplifier means for amplifying sound signals, the amplifier means being mounted on the first surface of the substrate;

a volume control housing having a housing perimeter and a first end;

a volume control mounted within the volume control housing; and a plurality of circumferentially spaced conductive tabs extending from the first end of the volume control housing at the housing perimeter to the substrate at the substrate perimeter for securing the volume control housing to the substrate, the conductive tabs electrically connected to the volume control and to the amplifier means.

2. The module of claim 1 wherein the volume control module is configured to be releasably connected to a hearing aid faceplate assembly having a power source, a microphone and a speaker, the volume control module further comprising;

conductor means for electrically coupling the volume control module to the hearing aid faceplate assembly.

3. The module of claim 2 wherein the conductor means further comprises:

first conductor means for coupling the volume control module to the power source;

second conductor means for coupling the volume control module to the microphone; and third conductor means for coupling the volume control module to the speaker.

4. The module of claim 3 wherein the conductor means further comprises:

strain relief means for supporting the first, second and third conductor means.

5. The module of claim 1 and further comprising:

tab receiving notches in the substrate circumferentially spaced about the substrate perimeter and having associated contact terminals electrically coupled to the amplifier means; and wherein the conductive tabs extend into the tab receiving notches and are electrically connected to the contact terminals in the substrate.

6. The module of claim 5 wherein the arrangement of the tab receiving notches about the substrate perimeter corresponds to the arrangement of the conductive tabs about the volume control housing perimeter.

7. The module of claim 6 wherein the substrate perimeter is substantially the same as the volume control housing perimeter.

8. The module of claim 7 wherein the substrate perimeter and the volume control housing perimeter are substantially circular.

9. The module of claim 5 wherein the volume control includes:

an on/off switch; and a control potentiometer.

10. The module of claim 9 wherein the conductive tabs are electrically coupled to the on/off switch and the control potentiometer in the volume control.

11. A hearing aid faceplate assembly, including:

a faceplate having a volume control/switch receiving aperture;

a volume control/switch integrated circuit assembly releasably mounted within the aperture and including:

a module substrate having a substrate perimeter;

amplifier means, for amplifying sound signals, mounted to the substrate;

a volume control housing having a housing perimeter and a first end;

a volume control mounted within the volume control housing; and a plurality of circumferentially spaced conductive tabs extending from the first end of the volume control housing at the housing perimeter to the substrate at the substrate perimeter for securing the volume control housing to the substrate, the conductive tabs electrically connected to the volume control and to the amplifier means.

12. The hearing aid face plate assembly of claim 11 and further comprising:

a battery contact aperture in the faceplate for receiving a battery;

a speaker mounted on the faceplate; and a microphone mounted on the faceplate.

13. The hearing aid faceplate assembly of claim 12 and further comprising:

module coupling means for electrically coupling the volume control/switch integrated circuit assembly to the battery contact, the microphone and the speaker.

14. The hearing aid faceplate assembly of claim 13 wherein the module coupling means further comprises:

first conductor means for electrically coupling the volume control/switch integrated circuit assembly to the speaker;

second conductor means for electrically coupling the volume control/switch integrated circuit assembly to the microphone; and third conductor means for electrically coupling the volume control/switch integrated circuit assembly to the battery contacts.

15. The hearing aid faceplate assembly of claim 14 wherein the module coupling means further comprises:

strain relief means for supporting the first, second and third conductor means.

16. The hearing aid faceplate assembly of claim 11 wherein:

the substrate perimeter comprises:

tab receiving notches, each tab receiving notch having an associated contact terminal electrically coupled to the amplifier means; and the conductive tabs extend into the tab receiving notches of the substrate perimeter making electrical connection with the associated contact terminals.

17. The hearing aid faceplate assembly of claim 16 wherein the substrate perimeter and the volume control housing perimeter are substantially the same.

18. The hearing aid faceplate assembly of claim 16 wherein:

the substrate perimeter and the volume control housing perimeter are substantially circular; and the substrate perimeter has a diameter which is slightly less than the diameter of the volume control housing perimeter.

19. The hearing aid faceplate assembly of claim 16 wherein:

the volume control includes an on/off switch and a control potentiometer; and the conductive tabs are electrically connected to the on/off switch and the control potentiometer.

20. A miniature volume control and integrated circuit assembly, including:

a volume control, comprising:

a housing having first and second ends and having a housing-end area defined by a housing perimeter;

a potentiometer mounted within the housing;

an on/off switch mounted within the housing;

a control knob coupled to the potentiometer and the on/off switch and rotatably mounted to the first end of the housing;

a plurality of potentiometer contacts extending from the housing perimeter at the second end of the housing;

a plurality of switch contacts extending from the housing perimeter at the second end of the housing; and wherein the potentiometer contacts and the switch contacts are circumferentially spaced about the housing perimeter; and an integrated circuit assembly mounted to the volume control, comprising:

a substrate having a substrate area defined by a substrate perimeter and having a plurality of circumferentially spaced contacts, the substrate area being no larger than the housing-end area, and the contacts being electrically coupled to the potentiometer contacts and the switch contacts; and an integrated circuit amplifier mounted to the substrate and having amplifier terminals coupled to the contacts of the substrate.

21. The assembly of claim 20 wherein:

the potentiometer contacts further comprise: first, second and third potentiometer contacts extending from the housing; and the contacts on the substrate further comprise: first, second and third potentiometer receiving contacts for receiving the first, second and third potentiometer contacts.

22. The assembly of claim 21 wherein:

the first, second and third potentiometer contacts extend from the perimeter of the housing; and the potentiometer receiving contacts include first, second and third notches in the substrate perimeter, the first second and third potentiometer contacts on the substrate being positioned in the first, second and third notches.

23. The assembly of claim 22 wherein the substrate perimeter is generally equal to the housing perimeter.

24. The assembly of claim 23 wherein the housing perimeter and the substrate perimeter are generally circular.

25. The assembly of claim 20 wherein:

the potentiometer contacts further comprise: first and second switch contacts extending from the housing; and the contacts on the substrate further comprise:

first and second switch receiving contacts for receiving the first and second switch contacts.

26. The assembly of claim 25 wherein:

the first and second switch contacts extend from the housing perimeter; and the switch receiving contacts include first and second switch notches in the substrate perimeter, the first and second switch receiving contacts being positioned in the first and second switch notches.

27. A volume control module, comprising:

a cylindrical housing, having a housing perimeter and first and second ends, and containing a control potentiometer and an on/off switch;

a rotatable cap coupled to the first end of the cylindrical housing and being mechanically coupled to the control potentiometer and the on/off switch;

a plurality of conductive mounting tabs electrically coupled to the control potentiometer and the on/-off switch and circumferentially arranged about the housing perimeter and extending from the second end of the cylindrical housing; and an integrated circuit assembly, coupled to the conductive mounting tabs, including:

a substrate having a generally circular substrate perimeter which is no larger than the housing perimeter;

an amplifier mounted to the substrate and having amplifier terminals; and a plurality of tab receiving notches having associated contact terminals electrically coupled to the amplifier terminals, the tab receiving notches being circumferentially arranged about the substrate perimeter to substantially correspond with the conductive mounting tabs, and receiving the conductive mounting tabs, the contact terminals making electrical connection with the conductive mounting tabs thereby electrically coupling the amplifier terminals with the on/off switch and the control potentiometer.

* * * * *

UNITED STATES PATENT AND TRADEMARK OFFICE

CERTIFICATE OF CORRECTION

PATENT NO. : 5,001,762

DATED : March 19, 1991

INVENTOR(S) : David R. Barwig et al.

It is certified that error appears in the above-identified patent and that said Letters Patent is hereby corrected as shown below:

Title page:

In the Title, delete "AIR", insert --AID--.

Signed and Sealed this

Fourth Day of August, 1992

*Attest:*

DOUGLAS B. COMER

*Attesting Officer* *Acting Commissioner of Patents and Trademarks*